United States Patent
Togawa et al.

(10) Patent No.: US 9,181,631 B2
(45) Date of Patent: Nov. 10, 2015

(54) SILICON CRYSTALLINE MATERIAL AND METHOD FOR MANUFACTURING THE SAME

(75) Inventors: Shinji Togawa, Nagasaki (JP); Ryosuke Ueda, Nagasaki (JP)

(73) Assignee: SUMCO TECHXIV CORPORATION, Nagasaki (JP)

( * ) Notice: Subject to any disclaimer, the term of this patent is extended or adjusted under 35 U.S.C. 154(b) by 1007 days.

(21) Appl. No.: 12/524,737

(22) PCT Filed: Jan. 23, 2008

(86) PCT No.: PCT/JP2008/050882
§ 371 (c)(1),
(2), (4) Date: Jul. 28, 2009

(87) PCT Pub. No.: WO2008/093576
PCT Pub. Date: Aug. 7, 2008

(65) Prior Publication Data
US 2010/0116194 A1    May 13, 2010

(30) Foreign Application Priority Data
Jan. 31, 2007  (JP) ................. 2007-021044

(51) Int. Cl.
*C30B 15/00*   (2006.01)
*C30B 29/06*   (2006.01)
(Continued)

(52) U.S. Cl.
CPC ............... *C30B 29/06* (2013.01); *C30B 13/285* (2013.01); *C30B 13/32* (2013.01); *C30B 15/22* (2013.01)

(58) Field of Classification Search
CPC ...... C30B 15/30; C30B 15/00; C30B 13/285; C30B 13/32; C30B 15/22; C30B 15/305; C30B 15/34; C30B 29/06; C30B 29/20; Y10S 117/911; Y10S 117/917; Y10T 117/1072; Y10T 117/1032; Y10T 117/1068
See application file for complete search history.

(56) References Cited

U.S. PATENT DOCUMENTS 6,117,234 A  *  9/2000  Yamagishi ................ 117/218
6,159,282 A     12/2000  Fujiwara
(Continued)

FOREIGN PATENT DOCUMENTS

EP    0 286 133     10/1988
JP    62-288191     12/1987
(Continued)

OTHER PUBLICATIONS

Meroli "Two growth techniques for mono-crystalline silicon: Czochralski vs Float Zone", Apr. 25, 2012, pp. 1-4 http://meroli.web.cern.ch/meroli/Lecture_silicon_floatzone_czochralski.html.*
(Continued)

*Primary Examiner* — Yelena G Gakh
(74) *Attorney, Agent, or Firm* — Greenblum & Bernstein, P.L.C.

(57) ABSTRACT

Provided is a silicon crystalline material, which is manufactured by a CZ method to be used as a material bar for manufacturing a silicon single crystal by an FZ method and has a grasping section for being loaded in a crystal growing furnace employing the FZ method without requiring mechanical processing. A method for manufacturing such silicon crystalline material is also provided. The silicon crystalline material is manufactured by the silicon crystal manufacturing method employing the CZ method and is provided with the grasping section, which is manufactured in a similar way as a shoulder portion, a straight body portion and a tail portion in a silicon crystal growing step employing the CZ method, and is loaded in a single crystal manufacturing apparatus employing the FZ method to grow single crystals. A seed-crystal used in the silicon crystal manufacture employing the CZ method is used as the grasping section. The grasping section is manufactured by temporarily changing crystal growing conditions to form a protruding section or a recessed section on the outer circumference surface of the straight body section or by forming a dent on the shoulder portion of the straight body portion, at the time of manufacturing the silicon crystal by the CZ method.

5 Claims, 5 Drawing Sheets

(51) Int. Cl.
    *C30B 13/28*      (2006.01)
    *C30B 13/32*      (2006.01)
    *C30B 15/22*      (2006.01)

(56) References Cited

U.S. PATENT DOCUMENTS

| | | |
|---|---|---|
| 6,197,108 B1 | 3/2001 | Iino et al. |
| 6,840,998 B2 | 1/2005 | Altmannshofer et al. |
| 7,335,257 B2 | 2/2008 | Jensen et al. |

FOREIGN PATENT DOCUMENTS

| | | |
|---|---|---|
| JP | 63-252991 | 10/1988 |
| JP | 10-72279 | 3/1998 |
| JP | 10-324594 | 12/1998 |
| JP | 11-199372 | 7/1999 |
| JP | 2003-55089 | 2/2003 |
| JP | 2005-281076 | 10/2005 |
| JP | 2005-306653 | 11/2005 |
| JP | 2006-517173 | 7/2006 |
| JP | 2007-021044 | 2/2007 |
| JP | 2008-87984 | 4/2008 |
| WO | 98/09007 | 3/1998 |
| WO | 2004/072333 | 8/2004 |

OTHER PUBLICATIONS

Extended European Search Report issued with respect to EP Application No. 08710571.4, dated Nov. 18, 2010.
International Search Report for PCT/JP2008/050882, mailed Apr. 8, 2008.

\* cited by examiner

SILICON CRYSTALLINE MATERIAL AND METHOD FOR MANUFACTURING THE SAME

TECHNICAL FIELD

The present invention relates to a silicon crystal material used as a raw material ingot for manufacturing a silicon single crystal by the FZ method (floating zone melting method) and a manufacturing method thereof, and particularly relates to a silicon crystal material and a manufacturing method thereof for manufacturing a large diameter of FZ silicon single crystal at low cost.

BACKGROUND ART

Currently, silicon is typically used as a semiconductor that is widely industrially used as a device for an integrated circuit (IC) and a large-scale integrated circuit (LSI). A silicon single crystal used in the semiconductor industry and the like is manufactured from polycrystalline silicon as raw materials by the floating zone melting method (FZ method for short) in which the bar-shaped polycrystalline silicon is melted by induction heating and a single crystal is grown, or by the Czochralski method (CZ method for short) in which the polycrystal is heated and melted in a crucible, a seed crystal is immersed in a melt and withdrawn therefrom, and a single crystal ingot is grown below the seed crystal.

A manufacturing method is selected from these methods in accordance with usage of the single crystal. In general, a single crystal manufactured by the FZ method is used for high resistivity and a single crystal manufactured by the CZ method is used for low to moderate resistivity.

In recent years, reduction in parasitic capacitance is required in a semiconductor device for mobile communication and in a leading-edge C-MOS device. It is reported that signal loss in transmission and parasitic capacitance in Schottky barrier diode can be effectively reduced by using a substrate of high resistivity. Given this, a high resistivity silicon wafer manufactured by the floating zone melting method (FZ method) is used for manufacturing a power device such as a high-voltage power device, a thyristor or the like.

Meanwhile, in recent years, a large diameter silicon wafer is sought for improving performance and reducing cost of a semiconductor device. Consequently, a large diameter FZ silicon single crystal of at least 150 mm in diameter is required, and thus development of a manufacturing method thereof has been awaited.

In a case of manufacturing a large diameter silicon single crystal, particularly of at least 150 mm in diameter, by the FZ method, a polycrystalline silicon material having a diameter of at least 140 mm is considered to be preferably used as a raw material ingot. For example, for manufacturing a silicon single crystal of 200 mm in diameter, a method using polycrystalline silicon having a diameter of at least 145 mm as a silicon raw material ingot is disclosed in Japanese Unexamined Patent Application Publication No. 2003-55089 (hereinafter referred to as Patent Document 1).

As described above, it is generally profitable to manufacture a silicon single crystal from a silicon raw material ingot with a diameter as large as possible, from a perspective of productivity and the like. However, since a silicon raw material ingot for polycrystalline silicon that is commercially available is manufactured by vapor phase growth, it is difficult to manufacture a large diameter polycrystalline silicon, particularly of at least 150 mm in diameter. In addition, polycrystalline silicon of a large diameter has a drawback of having a nonuniform grain boundary structure. Consequently, a problem of an extremely low yield is reported, in a case of manufacturing a silicon single crystal of 200 mm in diameter by the FZ method using a polycrystalline silicon raw material ingot of 160 mm in diameter, since a single manufacturing process by the FZ method cannot make a single crystal dislocation free and therefore the process must be repeated. Furthermore, polycrystalline silicon of a large diameter has another drawback of having a high unit cost.

On the other hand, an attempt is being made to manufacture an FZ silicon single crystal by using a large diameter CZ silicon crystal bar obtained by the CZ method (for example, see Japanese Unexamined Patent Application Publication No. 2005-281076 and 2005-306653, hereinafter referred to as Patent Documents 2 and 3).

DISCLOSURE OF THE INVENTION

Problems to be Solved by the Invention

In a case of crystal growth by the FZ method, a silicon crystal material, which is a raw material silicon bar, is required to be maintained suspended in an FZ furnace. However, a common silicon crystal material manufactured by the CZ method, which is cylindrical, does not have a portion to be gripped. Consequently, the silicon crystal material manufactured by the CZ method must be subjected to cutting of a shoulder portion and a tail portion thereof and mechanical processing for forming a groove and the like, and then loaded into an FZ furnace, being gripped at the groove or the like. In addition, fixing by a screw or the like is required, as disclosed in Patent Documents 2 and 3. As described above, since an operation for forming a groove or the like, which is to be gripped, on the silicon crystal material is required, the manufacturing process becomes complex, material is lost in the operation, and cycle time becomes longer.

The present invention is made in view of the abovementioned problems, and aims at providing a silicon crystal material that is manufactured by the CZ method and used for manufacturing a silicon single crystal by the FZ method, which can be loaded into and withdrawn from an FZ furnace without requiring mechanical processing, and a manufacturing method thereof.

Means for Solving the Problems

The present inventors have thoroughly researched in order to solve the abovementioned problems. As a result, the present inventors have found that a gripped portion, which is to be gripped by a gripper and allows loading into and withdrawal from an FZ furnace, can be formed by temporarily changing a growth condition of crystal in manufacturing of a silicon raw material ingot by the CZ method, which is used for manufacturing a silicon single crystal by the FZ method, thus leading to the completion of the present invention. More specifically, the present invention provides the following.

In a first aspect of the present invention, a silicon crystal material that is manufactured by a CZ method and used for manufacturing a silicon single crystal by an FZ method includes: a shoulder portion that gradually grows in diameter; a straight body portion that is cylindrical; a tail portion that gradually reduces in diameter; and a gripped portion that is gripped by a gripper during manufacturing of the silicon single crystal by the FZ method and that enables loading of the silicon crystal material into a furnace and growth of a single crystal, in which the gripped portion is, as with the shoulder portion, the straight body portion, and the tail portion, formed in a manufacturing process of the silicon crystal material by the CZ method.

According to the first aspect, the silicon crystal material used for manufacturing a silicon single crystal by the FZ method has a gripped portion, which allows loading the silicon crystal material into an FZ single crystal manufacturing device and single crystal growth therein, formed in a manufacturing process of the silicon crystal material by the CZ method as with the shoulder portion, the straight body portion, and the tail portion of the silicon crystal. Therefore, the silicon crystal material manufactured by the CZ method can be used as a raw material ingot for manufacturing an FZ silicon single crystal without post-processing for forming the gripped portion. This can reduce loss of material due to the post-processing and cycle time for the FZ silicon single crystal manufacturing.

According to a second aspect of the present invention, in the silicon crystal material as described in the first aspect, the gripped portion is a convex portion formed along a circumference of the straight body portion.

According to the second aspect of the present invention, since a convex portion is formed along a circumference of the straight body portion, the silicon crystal material can be maintained suspended by the convex portion being hooked by a gripper, and easily loaded into an FZ single crystal manufacturing device.

According to a third aspect of the present invention, in the silicon crystal material as described in the first aspect, the gripped portion is a concave portion formed along a circumference of the straight body portion.

According to the third aspect of the present invention, since a concave portion is formed along a circumferential direction of the straight body portion, the silicon crystal material can be maintained suspended by the concave portion being hooked by a gripper, and easily loaded into an FZ single crystal manufacturing device.

According to a fourth aspect of the present invention, in the silicon crystal material as described in the first aspect, the gripped portion is a constricted portion formed above the shoulder portion.

According to the fourth aspect of the present invention, since a constricted portion is formed above the shoulder portion, the silicon crystal material can be maintained suspended by the constricted portion being hooked by a gripper, and easily loaded into an FZ single crystal manufacturing device.

In a fifth aspect of the present invention, a silicon crystal material that is manufactured by a CZ method and used for manufacturing a silicon single crystal by an FZ method includes: a shoulder portion that gradually grows in diameter; a straight body portion that is cylindrical; a tail portion that gradually reduces in diameter; and a gripped portion that is gripped by a gripper during manufacturing of the silicon single crystal by the FZ method and that enables loading of the silicon crystal material into a furnace and growth of a single crystal, in which the gripped portion is a seed crystal used in a manufacturing process of the silicon crystal material by the CZ method.

According to the fifth aspect of the present invention, the silicon crystal material can be maintained suspended by the seed crystal which is used in the manufacturing process thereof by the CZ method being hooked by a gripper, and easily loaded into an FZ single crystal manufacturing device. In addition, since the silicon crystal material manufactured by the CZ method is used as a raw material ingot, the seed crystal and a main crystal body (the straight body portion) have a concentric rotational center. Therefore there is no need for a centering operation for rotation after loading into the FZ furnace and the processing can be further simplified.

In a sixth aspect of the present invention, in a manufacturing method of a silicon crystal material used for manufacturing a silicon single crystal by an FZ method, the silicon crystal material includes: a shoulder portion that gradually grows in diameter; a straight body portion that is cylindrical; a tail portion that gradually reduces in diameter; and a gripped portion that is gripped by a gripper during manufacturing of the silicon single crystal by the FZ method and that enables loading of the silicon crystal material into a furnace and growth of a single crystal, and the shoulder portion, the straight body portion, the tail portion, and the gripped portion are formed by a CZ method.

According to the sixth aspect of the present invention, the gripped portion for maintaining the silicon crystal material suspended inside an FZ furnace is formed by the CZ method, as with the shoulder portion, the straight body portion, and the tail portion. In other words, in manufacturing of a silicon crystal material by the CZ method, the convex portion, the concave portion, or the constricted portion is formed in a phase of growing the straight body portion or in a phase where growth moves from a neck portion to the shoulder portion or the like. Therefore, the silicon crystal material manufactured by the CZ method can be used as a raw material ingot for manufacturing an FZ silicon single crystal without post-processing for forming the gripped portion. This can reduce loss of material due to the post-processing and cycle time for the FZ silicon single crystal manufacturing.

According to a seventh aspect of the present invention, in the manufacturing method of a silicon crystal material as described in the sixth aspect, the gripped portion is formed by changing a crystal growth condition at a predetermined point of time in a manufacturing process of the silicon crystal material by the CZ method.

According to the seventh aspect of the present invention, in the manufacturing process of the silicon crystal material by the CZ method, diameter of crystal can be changed by changing a crystal growth condition. Consequently, a concave portion and a convex portion can be formed by, for example, changing a crystal growth condition at a predetermined timing for a predetermined period of time, in a phase of crystal growth in the straight body portion. In addition, a constricted portion of a rhombus bead shape can be formed by changing the crystal growth condition in a phase where growth moves the shoulder portion or the like.

The crystal growth condition is changed by, for example, increase and decrease in a single crystal growth rate and/or raising and lowering of temperature of a melt obtained by melting a raw material silicon polycrystal, in other words raising and lowering of heating temperature.

According to an eighth aspect of the present invention, in the manufacturing method of a silicon crystal material as described in the seventh aspect, the crystal growth condition is changed by changing at least any one of single crystal growth rate and temperature of raw material silicon melt.

According to the eighth aspect of the present invention, crystal diameter becomes larger by lowering single crystal growth rate. On the other hand, crystal diameter becomes smaller by raising the single crystal growth rate. Thus, a convex portion and a concave portion can be formed on the straight body portion by temporarily changing the single crystal growth rate in a phase of crystal growth in the straight body portion. In addition, the constricted portion having a substantially diamond-shape in the vertical cross section (having a rhombus bead shape) can be formed by temporarily changing the single crystal growth rate during formation of the neck portion.

Furthermore, a convex portion and a concave portion can be formed by temporarily changing temperature of a melt during formation of the straight body portion, by raising and lowering temperature of the melt, in other words heating temperature by a heater. Moreover, the constricted portion having a substantially diamond-shape in the vertical cross section (having a rhombus bead shape) can be formed by temporarily changing temperature of the melt during formation of a neck portion. This is because the melt easily solidifies at low temperature and not at high temperature, thereby changing crystallization. It should be noted that the temperature of the melt is raised and lowered generally by raising and lowering heating temperature by a heater.

In a ninth aspect of the present invention, in a manufacturing method of an FZ silicon single crystal, the silicon single crystal is manufactured by the FZ method using the silicon crystal material according to any one the first to the fifth aspects.

According to the ninth aspect of the present invention, since the silicon crystal material as described in any one of the first to the fifth aspects has the gripped portion formed in the manufacturing process by the CZ method, the silicon crystal material can be used, without post-processing for forming the gripped portion thereon, for manufacturing a silicon single crystal by the FZ method. This can reduce loss of material and cycle time for manufacturing. In addition, since a large diameter silicon crystal material can be obtained by the CZ method, a large diameter silicon single crystal can be obtained by using the silicon crystal material as a raw material ingot.

Effects of the Invention

The silicon crystal material according to the present invention is manufactured in a silicon crystal manufacturing method according to the CZ method and has the gripped portion that can be mechanically gripped, formed in a crystal manufacturing process. Therefore the silicon crystal material can be used, without post-processing for forming the gripped portion thereon, as a raw material ingot for the FZ method. This can reduce loss of material in processing and cycle time for the FZ silicon single crystal manufacturing. In addition, since the silicon crystal material according to the present invention is manufactured by growing a crystal by the CZ method, a large diameter crystal material can be obtained at low cost. Consequently, a large diameter silicon single crystal can be obtained at low cost by manufacturing an FZ single crystal using this silicon crystal material as a raw material ingot.

Furthermore, in the manufacturing method according to the present invention, the gripped portion that can be mechanically gripped can be formed only by temporarily changing a single crystal growth rate and temperature of a melt, in other words heating temperature by a heater, in a silicon crystal growth process by the CZ method. Therefore, the silicon crystal material thus obtained can be used as a raw material ingot for manufacturing an FZ silicon single crystal without post-processing.

PREFERRED MODE FOR CARRYING OUT THE INVENTION

Figure 1:
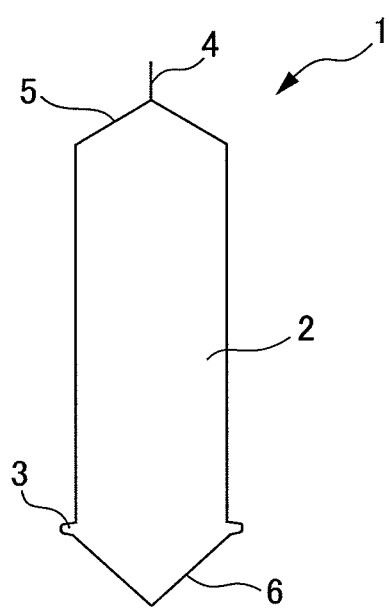
FIG. 1 is a schematic vertical sectional view of a silicon crystal material according to a first embodiment of the present invention.

A silicon crystal material and a manufacturing method thereof according to the present invention are described in detail hereinafter.

The silicon crystal material according to the present invention is characterized by that the silicon crystal material is manufactured in a silicon crystal manufacturing method according to the CZ method; and has a gripped portion that is attached to an FZ single crystal manufacturing device and allows the silicon crystal material to be maintained suspended, where the gripped portion is formed in manufacturing of a silicon crystal by the CZ method not by post-processing, or is a seed crystal used for manufacturing a silicon crystal by the CZ method. In addition, the manufacturing method of a silicon crystal material according to the present invention is characterized by forming the gripped portion on the silicon crystal by temporarily changing a crystal growth condition in a manufacturing process of the silicon crystal by the CZ method.

Embodiments of the silicon crystal material according to the present invention are described hereinafter with reference to the drawings. It should be noted that an embodiment of the present invention and a technical scope of the present invention are not limited to the following embodiments. In the following description of the embodiments, similar components are designated by the same reference numerals, with the description thereof simplified or omitted.

Silicon Crystal Material With Convex Gripped Portion

FIG. 1 is a sectional view schematically illustrating a silicon crystal material according to a first embodiment of the present invention. A silicon crystal material 1 is composed of: a straight body portion 2; a convex portion (gripped portion) 3 that is formed in an annular shape on a periphery of the straight body portion 2; a neck portion 4 formed during single crystal growth of a CZ crystal; a shoulder portion 5 that is continuous with the neck portion 4 and constitutes an upper portion of the straight body portion 2; and a tail portion 6 that constitutes a lower portion of the straight body portion 2. The convex portion (gripped portion) 3 is formed in a manufacturing process of a silicon crystal by the CZ method, on a periphery of the straight body portion 2, so as to have a diameter larger than an external diameter of the straight body portion 2. It should be noted that, although the convex portion (gripped portion) 3 is formed on the tail portion 6 side in the present embodiment, the present invention is not limited thereto and the convex portion 3 can also be formed on the shoulder portion 5 side.

Although the diameter of the convex portion (gripped portion) 3 varies dependent on a shape, a structure and the like of a gripper for gripping the silicon crystal material, the diameter of the convex portion (gripped portion) 3 is preferably greater than the external diameter of the straight body portion 2 by about 6 to 20 mm. In addition, a length thereof is preferably about 7 to 25 mm. As used herein, the length means a size corresponding to a thickness in a vertical direction (a longitudinal direction of the straight body portion).

Manufacturing Method

The silicon crystal material 1 with the convex portion 3 as the gripped portion can be manufactured in a conventional manufacturing method of a silicon crystal by the CZ method. That is, a silicon crystal material is manufactured by: filling a crucible such as a quartz crucible with a raw material which is an agglomerate of silicon polycrystal; immersing a seed crystal into a raw material melt, in which the silicon polycrystal is melt down by heating by a heater and the like; and growing a crystal up to a predetermined size, for example 155 mm in diameter and 1150 mm in length of the straight body portion while rotating the seed crystal and the crucible in inverse directions. It should be noted that a crystal growth condition is set in accordance with a desired diameter of crystal.

In a crystal growth process, the crystal growth condition is temporarily changed by, for example, temporarily lowering a single crystal growth rate for forming the straight body portion, temporarily lowering temperature of the melt (heating temperature by a heater) or the like. By thus temporarily changing the crystal growth condition, an external diameter of the straight body portion 2 grows larger and the annular shaped convex portion is formed. The single crystal growth rate and the temperature of the melt (the heating temperature by the heater) are set in accordance with a desired size of the convex portion, and a configuration of a CZ furnace used and components inside the furnace.

The convex portion 3 can be formed either after forming the straight body portion 2 or before forming the tail portion 5, or after forming the shoulder portion 5 and before forming the straight body portion.

Silicon Crystal Material With Concave Gripped Portion

Figure 2:
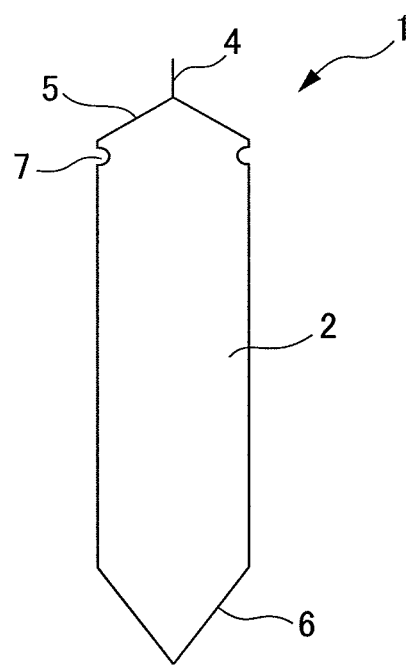
FIG. 2 is a schematic vertical sectional view of a silicon crystal material according to a second embodiment of the present invention.

FIG. 2 is a sectional view schematically illustrating a silicon crystal material according to a second embodiment of the present invention. A silicon crystal material 1 is composed of: a straight body portion 2; a concave portion (gripped portion) 7 that is formed in a groove-like shape on a periphery of the straight body portion 2; a neck portion 4 formed during single crystal growth of a CZ crystal; a shoulder portion 5 that is continuous with the neck portion 4 and constitutes an upper portion of the straight body portion 2; and a tail portion 6 that constitutes a lower portion of the straight body portion 2. The concave portion (gripped portion) 7 is formed in a manufacturing process of a silicon crystal by the CZ method, on a periphery of the straight body portion, so as to have a diameter smaller than an external diameter of the straight body portion 2. It should be noted that, although the concave portion (gripped portion) 7 is formed on the shoulder portion 5 side in the present embodiment, the present invention is not limited thereto and the convex portion 3 can also be formed on the tail portion 6 side.

Although the diameter of the concave portion (gripped portion) 7 varies dependent on shape, structure and the like of a gripper for gripping the silicon crystal material, the diameter of the concave portion (gripped portion) 7 is preferably smaller than the external diameter of the straight body portion 2 by about 6 to 20 mm. In addition, a length thereof is preferably about 5 to 10 mm. As used herein, the length means a size corresponding to width of the concave portion in a vertical direction (a longitudinal direction of the straight body portion).

Manufacturing Method

The silicon crystal material 1 with the concave portion 7 as the gripped portion, similar to the above, can be manufactured in a conventional manufacturing method of a silicon crystal by the CZ method. That is, a silicon crystal material is manufactured by: filling a crucible such as a quartz crucible with a raw material which is an agglomerate of silicon polycrystal; immersing a seed crystal into a raw material melt, in which the silicon polycrystal is melt down by heating by a heater and the like; and growing a crystal up to a predetermined size, for example 155 mm in diameter and 1150 mm in length of the straight body portion while rotating the seed crystal and the crucible in inverse directions. It should be noted that a crystal growth condition is set in accordance with a desired diameter of crystal.

In a crystal growth process, the growth condition is temporarily changed by, for example, temporarily increasing single crystal growth rate for forming the straight body portion, temporarily raising temperature of the melt (heating temperature by a heater) or the like. By thus changing the crystal growth condition, growth in external diameter of the straight body portion 2 is suppressed and the concave portion is formed. The single crystal growth rate and the temperature of the melt (the heating temperature by the heater) are set in accordance with a desired size of the concave portion, and a configuration of a CZ furnace used and components inside the furnace. In addition, the concave portion 7 can be formed either after forming the straight body portion 2 or before forming the tail portion 5, or after forming the shoulder portion 5 and before forming the straight body portion.

Silicon Crystal Material With Constricted Gripped Portion

Figure 3:
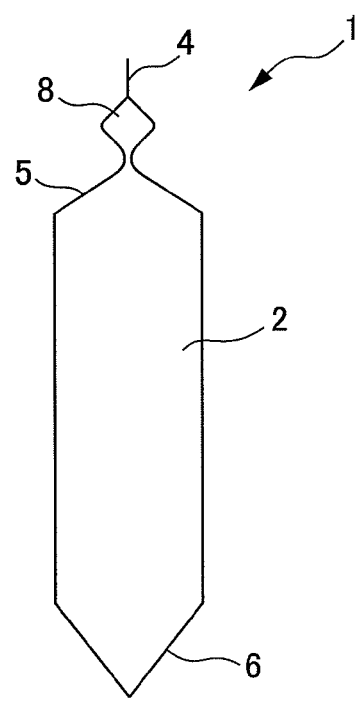
FIG. 3 is a schematic vertical sectional view of a silicon crystal material according to a third embodiment of the present invention.

FIG. 3 is a sectional view schematically illustrating silicon crystal material according to a third embodiment of the present invention. A silicon crystal material 1 is composed of: a straight body portion 2; a neck portion 4 formed during single crystal growth of a CZ crystal; a constricted portion (gripped portion) 8 positioned between the straight body portion 2 and the neck portion 4; a shoulder portion 5 that is continuous with the constricted portion 8 and constitutes an upper portion of the straight body portion 2; and a tail portion 6 that constitutes a lower portion of the straight body portion 2. The constricted portion (gripped portion) 8 is formed in a manufacturing process of a silicon crystal by the CZ method, to have a rhombus bead shape (to have a vertical cross section being substantially diamond-shaped) above the straight body portion 2. It should be noted that, although the constricted portion (gripped portion) 8 is formed above the shoulder portion 5 in the present embodiment, the present invention is not limited thereto and the convex portion 3 can also be formed below the tail portion 6.

Although the constricted portion (gripped portion) 8 varies dependent on shape, structure and the like of a gripper for gripping the silicon crystal material, the constricted portion (gripped portion) 8 preferably has a rhombus bead shape (has a vertical cross section being substantially diamond-shaped) of about 20 to 50 mm in maximum diameter and 50 to 200 mm in length.

Manufacturing Method

The silicon crystal material 1 with the constricted portion 8 as the gripped portion, similar to the above, can be manufactured in a conventional manufacturing method of a silicon crystal by the CZ method. That is, a silicon crystal material is manufactured by: filling a crucible such as a quartz crucible with a raw material which is an agglomerate of silicon polycrystal; immersing a seed crystal into a raw material melt, in which the silicon polycrystal is melt down by heating by a heater and the like; and growing a crystal up to a predetermined size, for example 155 mm in diameter and 1150 mm in length of the straight body portion while rotating the seed crystal and the crucible in inverse directions. It should be noted that a crystal growth condition is set in accordance with desired diameter of crystal.

In a crystal growth process, in formation of a straight body portion of silicon crystal from a seed crystal, a growth condition is changed for a portion between the end of necking and beginning of forming the shoulder portion 5. In other words, in a process of forming the shoulder portion 5 under a crystal growth condition for forming the straight body portion 2, at the time where external diameter thereof reaches a predetermined size, a single crystal growth rate is raised for narrowing down the external diameter; and then, at the time where the external diameter is narrowed down to a predetermined size, the single crystal growth rate is reset to an original value for crystal growth of the straight body portion, thus forming the straight body portion 2. In such a configuration, for example, the constricted portion 8 having a rhombus bead shape (having a substantially diamond-shaped vertical cross section) of about 50 mm in diameter and 50 mm in length, is formed above the straight body portion 2. It should be noted that a condition for forming the constricted portion 8, in other words change in the single crystal growth rate and in the temperature of a melt (the temperature of a heater) can be arbitrarily set in accordance with a desired size of the constricted portion 8.

It should be noted that, in a case of forming the constricted portion 8 below the tail portion 6, the abovementioned process can be performed under the same growth condition after that the tail portion 6 is formed. In other words, after forming the tail portion 6, the single crystal growth rate is lowered for growing external diameter; and then, at the time where the external diameter is grown to a predetermined size, the single crystal growth rate is reset to an original value for forming the constricted portion of the abovementioned size.

Silicon Crystal Material With Seed Crystal Gripped Portion

Figure 4:
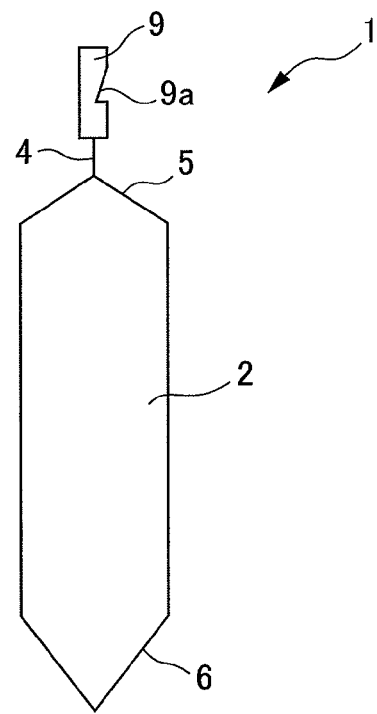
FIG. 4 is a schematic vertical sectional view of a silicon crystal material according to a fourth embodiment of the present invention.

FIG. 4 is a sectional view schematically illustrating a silicon crystal material according to a fourth embodiment of the present invention. A silicon crystal material 1 is composed of: a seed crystal 9; a neck portion 4 formed during single crystal growth of a CZ crystal; a straight body portion 2; a shoulder portion 5 that is continuous with the neck portion 4 and constitutes an upper portion of the straight body portion 2; and a tail portion 6 that constitutes a lower portion of the straight body portion 2. The seed crystal 9 is used in the manufacturing process of the silicon crystal by the CZ method. In other words, the silicon crystal material 1 is continuously formed with a seed crystal 9, the neck portion 4 and the straight body portion 2. The silicon crystal material 1 is obtained as following: the seed crystal is withdrawn after immersed in the melt; thus a silicon crystal grows behind the seed crystal; when the silicon crystal material 1 is removed from a CZ furnace, a portion from the neck portion 4 to the seed crystal 9 is kept intact. In the silicon crystal material 1, the seed crystal 9 is used as a gripped portion.

In the silicon crystal material 1, since the seed crystal 9 is gripped and maintained suspended, the neck portion 4 is preferably at least 5 mm in diameter. In a case where the diameter of the neck portion is less than 5 mm, the neck portion 4 may be broken in a process of growing an FZ silicon single crystal and thus the silicon crystal material 1 may drop off. In addition, the seed crystal 9 more preferably has a bored portion 9a. This allows the silicon crystal material 1 to be more firmly gripped and maintained suspended by a gripper (described later).

Manufacturing Method

The silicon crystal material with a gripped portion of the seed crystal 9, similar to the above, can be manufactured in a conventional manufacturing method of a silicon crystal by the CZ method. That is, a silicon crystal material is manufactured by: filling a crucible such as a quartz crucible with a raw material which is an agglomerate of silicon polycrystal; immersing a seed crystal into a raw material melt, in which the silicon polycrystal is melt down by heating by a heater and the like; and growing a crystal up to a predetermined size, for example 155 mm in diameter and 1150 mm in length of the straight body portion while rotating the seed crystal and the crucible in inverse directions.

The silicon crystal materials 1 manufactured as described above are silicon crystal materials manufactured by the CZ method, in which a gripped portion, which is gripped by a gripper of an FZ single crystal manufacturing device, is formed thereon during a process of manufacturing the crystal. Therefore, unlike a silicon raw material ingot conventionally used, a mechanical process is not required for forming the gripped portion, thereby reducing loss of material in processing and cycle time for manufacturing FZ silicon. In addition, a large diameter silicon crystal material can be obtained by the CZ method, and a large diameter FZ silicon single crystal can be obtained by using this silicon crystal material as a raw material ingot.

Manufacturing Method of FZ Silicon Single Crystal

Next, a manufacturing method of an FZ silicon crystal using the silicon crystal material according to the present invention is explained hereinafter.

Figure 5:
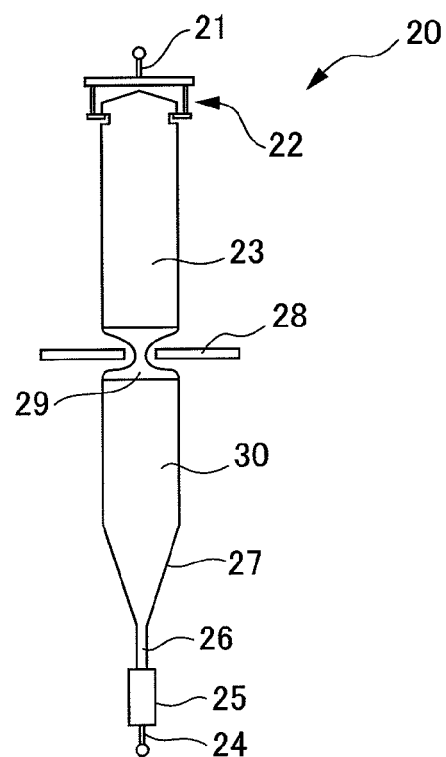
FIG. 5 is a schematic partial sectional view illustrating an example of an FZ single crystal manufacturing device according to the present invention.

FIG. 5 is a schematic partial sectional view illustrating an example of an FZ single crystal manufacturing device according to the present invention. An FZ single crystal manufacturing device 20 has a similar structure as a conventional FZ single crystal manufacturing device, and includes: a gripper 22 that grips a raw material ingot 23 (the silicon crystal material 1) and a superior axis 21 that is continuous therewith on an upper portion thereof; a crystal gripper 25 that grips a seed crystal and an inferior axis 24 that is continuous therewith on a lower portion thereof; and an induction heating coil (a high-frequency coil) 28 therebetween. The superior axis 21 and the inferior axis 24 allow the raw material ingot to rotate and to move up and down.

The abovementioned silicon crystal material 1 manufactured by the CZ method is, as shown in FIG. 5, gripped by the gripper 22 on the superior axis 21 of the FZ single crystal manufacturing device 20 that is installed in a chamber (not shown) of an FZ growth furnace, and set as a silicon raw material ingot 23. A seed crystal 26 for manufacturing an FZ silicon single crystal is set on the gripper for lower portion of the crystal 25 on the inferior axis 24.

More specifically, the silicon crystal material is set on the single crystal manufacturing device 20 as follows.

Figure 6:
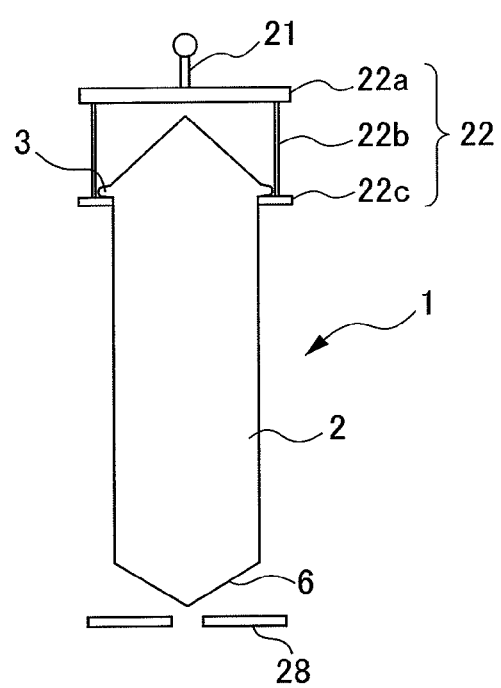
FIG. 6 is a partial sectional view schematically illustrating a state where the silicon crystal material according to the first embodiment of the present invention is gripped.

The silicon crystal material 1 having the convex portion 3 on the straight body portion 2 thereof, as described in the first embodiment, is gripped by a claw 22c provided on a lower end of a gripper rod 22b of the gripper 22 that is engaged with the convex portion 3, as shown in FIG. 6.

The gripper 22 is not particularly limited as long as a mechanism is provided for gripping by engaging with the convex portion 3, the concave portion 7, and the constricted portion 8 of the gripped portion; and the gripper 22, for example, can be composed of: a plate-like supportive portion 22a; a plurality (preferably at least 3 for supporting a weighty silicon crystal material from a perspective of stability) of gripper rods 22b that is rotatably attached to the supportive portion 22a; and a crow 22c that is provided on an end portion of the gripper rod 22b so as to form a substantially L-shape (see FIG. 6).

Figure 7:
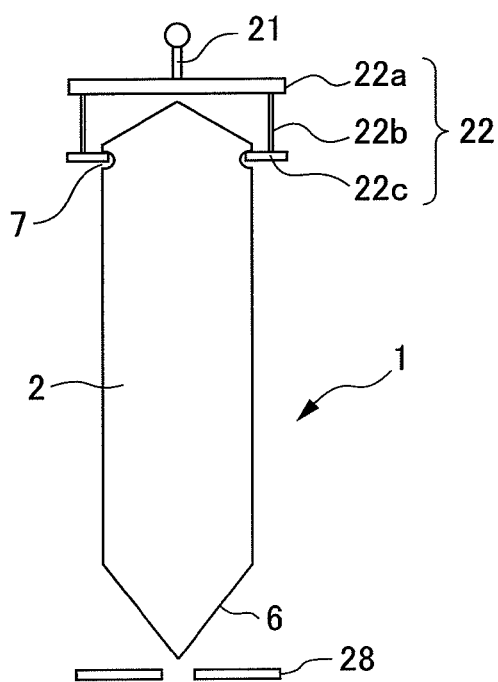
FIG. 7 is a partial sectional view schematically illustrating a state where the silicon crystal material according to the second embodiment of the present invention is gripped.

The silicon crystal material 1 having the concave portion 7 on the straight body portion 2 thereof, as described in the second embodiment, is gripped by the claw 22c provided on a lower end of the gripper rod 22b of the gripper 22 that is engaged with the concave portion 7, as shown in FIG. 7.

Figure 8:
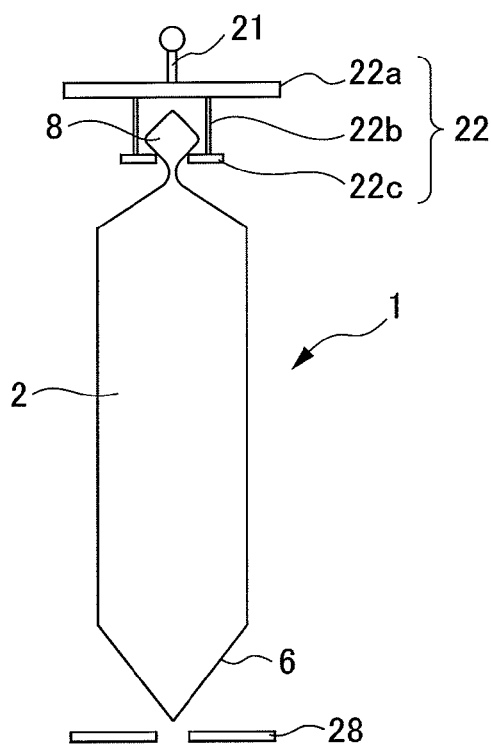
FIG. 8 is a partial sectional view schematically illustrating a state where the silicon crystal material according to the third embodiment of the present invention is gripped.

In addition, the silicon crystal material 1 having the constricted portion 8 on the straight body portion 2 thereof, as described in the third embodiment, is gripped by the claw 22c provided on a lower end of the gripper rod 22b of the gripper 22 that is engaged with the constricted portion 8, as shown in FIG. 8.

Figure 9:
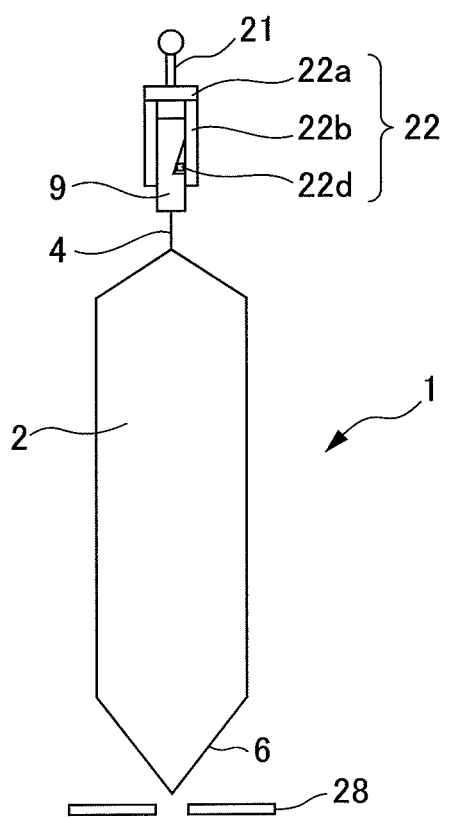
FIG. 9 is a partial sectional view schematically illustrating a state where the silicon crystal material according to the fourth embodiment of the present invention is gripped.

The silicon crystal material 1 composed of the seed crystal 9, the neck portion 4, and the straight body portion 2, as described in the fourth embodiment, is gripped at the seed crystal 9 by the gripper rod 22b of the gripper 22 as shown in FIG. 9. In this case, as a gripper, a pin 22d, which can be taken in and out toward the seed crystal side, is preferably formed on a side face of the gripper rod 22b facing the seed crystal 9. In such a configuration, the pin 22d of the gripper rod 22b is inserted into the bored portion 9a (see FIG. 4) formed on the seed crystal 9, thereby maintaining the silicon crystal material 1 suspended more firmly.

Subsequently, an apex of the silicon raw material ingot 23 (silicon crystal material 1), which is maintained suspended in the FX furnace, is preheated by a carbon ring (not shown).

Thereafter, Ar gas containing nitrogen gas is supplied from a lower portion of the chamber and discharged from an upper portion of the chamber, at a furnace pressure of 0.20 MPa, a feed rate of Ar gas of 50 L/min, and nitrogen concentration inside the chamber of 0.1%. Next, after heating and melting the apex of the silicon raw material ingot 23 by the induction heating coil (the high-frequency coil) 28, the molten apex of the silicon raw material ingot 23 is fused with the seed crystal 26 and made to be dislocation-free by necking, the silicon raw material ingot 23 is brought down and molten while rotating the superior axis 21 and the inferior axis 24 for supplying a melt to a melt zone 29, and a lower portion of the melt zone 29 is coagulated and recrystallized, thereby growing an FZ silicon single crystal 30. In this case, the superior axis 21 that is a rotational center when the silicon raw material ingot 23 is growing and the inferior axis 24 that is a rotational center of the silicon single crystal 30 in recrystallization are coaxial and rotate around a common rotational center. In addition, the axes preferably rotate back and forth alternately and grow the silicon single crystal 30. By rotating back and forth alternately, a silicon crystal in molten state is agitated in recrystallization, and thus quality, such as in-plane resistivity distribution, of the silicon single crystal 30 thus manufactured can be uniformized. A moving angle of backward and forward rotation, rotation speed and the like can be arbitrarily set in accordance with a diameter of the silicon single crystal 30.

In such a configuration, a dopant that is unavoidably contained in the silicon raw material ingot (silicon crystal material) 23 manufactured by the CZ method can be uniformly distributed in the melt zone and thus the dopant can also be uniformly distributed in the FZ silicon single crystal 30, thereby obtaining a silicon single crystal with a superior in-plane resistivity distribution.

In addition, the resistivity can be lowered by adding a dopant of the same conductivity type as that of the dopant contained in the original silicon raw material ingot 23. On the other hand, a silicon single crystal 30 of higher resistivity than the silicon raw material ingot 23 can be obtained by adding a dopant of an opposite conductivity type.

Gas doping can be performed according to a well-known method, by blowing a doping gas on the melt zone 29 at a predetermined feed rate. For example, in order to make the silicon single crystal 30 p-type, argon gas containing a minute amount of diborane ($B_2H_6$) can be used as doping gas. In order to make the silicon single crystal 30 n-type, argon gas containing phosphine ($PH_3$) can be used as doping gas. Resistivity in a growth direction of the silicon single crystal 30 can be uniformized by a method disclosed in Japanese Unexamined Patent Application Publication No. 2006-267287.

EXAMPLES

The present invention is described in more detail hereinafter by means of examples; however, the present invention is not limited thereto.

Example 1

A silicon crystal composed of a neck portion, a shoulder portion, and a straight body portion, for an FZ silicon crystal material, was prepared by a commonly practiced CZ method, thereby obtaining a silicon crystal material having a straight body portion of 155 mm in diameter and 1150 mm in length.

After forming the straight body portion and before forming a conical portion that is a tail portion of the crystal, single crystal growth rate was lowered to about one-third of the single crystal growth rate for the straight body portion, in order to temporarily grow crystal diameter, thereby forming a convex portion in a radial direction. After that, a built-up portion grew to about 10 mm and diameter of the convex portion reached 170 mm, and the single crystal growth rate was gradually turned back to the original single crystal growth rate before the change.

After that diameter of the straight body portion went down to 155 mm, a conventional tail portion was formed. The crystal growth was terminated with the tail portion of 50 mm in length, which was shorter than normal.

In the abovementioned operation, the convex portion of about 7.5 mm on one side and 20 mm in length could be formed immediately above the tail portion.

As a result, a silicon crystal material having a straight body portion of 155 mm in diameter and 1150 mm in length, with the convex portion of about 7.5 mm and about 20 mm in length formed immediately above the tail portion of the crystal, was manufactured.

The silicon crystal material thus obtained was loaded into an FZ furnace by fixing the convex portion with a gripper for silicon crystal material. Centering was performed for rotating the silicon crystal material.

Thereafter, a silicon single crystal was grown by a commonly practiced FZ method, thereby manufacturing an FZ silicon single crystal having a straight body portion of 1000 mm in length and 150 mm in diameter.

Example 2

A neck portion and a shoulder portion were formed by a normal CZ single crystal growth method, as in Example 1.

Subsequently, immediately after starting formation of a straight body portion, a single crystal growth rate was temporarily doubled. By this acceleration, diameter of the crystal went down from 155 mm to 140 mm at a maximum.

After that, a length of a concave portion reached about 7 mm, and the single crystal growth rate was gradually turned back to the original single crystal growth rate before the change, thereby making the crystal diameter 155 mm, the original value.

Thereafter, by a conventional operation, the straight body portion of 155 mm in diameter was grown to 1150 mm in length and finally a tail portion was formed. The crystal growth was thus terminated.

As a result, a silicon crystal material having a straight body portion of 155 mm in diameter and 1150 mm in length, with the concave portion of about 15 mm in depth and about 7 mm in length formed immediately below the shoulder portion of the crystal, was manufactured.

The silicon crystal material thus obtained was loaded into an FZ furnace by fixing the concave portion with a gripper for silicon crystal material as in Example 1. Centering was performed for rotating the silicon crystal material.

Thereafter, a silicon single crystal was grown by a commonly practiced EZ method, thereby manufacturing an FZ silicon single crystal having a straight body portion of 1000 mm in length and 150 mm in diameter.

Example 3

A neck portion was grown to about 50 mm below the seed crystal by a normal CZ single crystal growth method, as in Example 1, and then a single crystal growth rate was lowered to about one-fourth and a temperature of a heater was lowered by some degrees. A diameter of the neck portion, which had been 5 mm, was thus grown to 30 mm.

Thereafter, the single crystal growth rate and the temperature of the heater were gradually turned back to original values, and then a neck portion of 10 mm in diameter was grown to about 100 mm.

Next, a straight body portion was formed by an operation similar to that of a normal single crystal growth method, and a silicon crystal material having a straight body portion of 155 mm in diameter and 1150 mm in length was manufactured.

As a result, a silicon crystal material having a straight body portion of 155 mm in diameter and 1150 mm in length, with the constricted portion of a rhombus bead shape with a maximum diameter of 30 mm being formed in the neck portion of 150 mm in length, was manufactured.

The silicon crystal material thus obtained was loaded into an FZ furnace by fixing the constricted portion with a gripper for silicon crystal material as in Example 1. Centering was performed for rotating the silicon crystal material.

Thereafter, a silicon single crystal was grown by a commonly practiced FZ method, thereby manufacturing an FZ silicon single crystal having a straight body portion of 1000 mm in length and 150 mm in diameter.

Example 4

A silicon crystal material was manufactured by a normal CZ single crystal growth method, as in Example 1. In this case, unlike Examples 1 to 3, the single crystal was grown without temporarily changing the single crystal growth rate and the temperature of the heater.

After crystal growth by the CZ method, the silicon crystal material thus formed was removed from a CZ furnace in a state where a seed crystal, a neck portion, and a straight body portion were successively formed. The silicon crystal material having a straight body portion of 155 mm in diameter and 1150 mm in length, in which the seed crystal, the neck portion, and the straight body portion were linked, was thus manufactured.

Utilizing the seed crystal of the silicon crystal material thus obtained, the silicon crystal material was loaded into an FZ furnace by gripping the seed crystal portion with a gripper that houses the seed crystal inside and inserts a pin into a bored portion on the seed crystal. It should be noted that, in loading, the centering operation for rotation of the silicon crystal material inside the FZ furnace, which was performed in Examples 1 to 3, was not required since the seed crystal and a main crystal body (the straight body portion) had a common rotational center.

Thereafter, a silicon single crystal was grown by a commonly practiced FZ method, thereby manufacturing an FZ silicon single crystal having a straight body portion of 1000 mm in length and 150 mm in diameter.

Comparative Example 1

A silicon crystal material having a straight body portion of 155 mm in diameter and 1150 mm in length was manufactured according to a commonly practiced CZ method.

A shoulder portion or a tail portion of the silicon crystal material thus obtained was cut off and a groove of 5 mm in depth and 5 mm in length was formed on a peripheral surface of the vicinity of the portion being cut off, by a mechanical process.

Next, the silicon crystal material was loaded into an FZ furnace by fixing the groove with a gripper for silicon crystal material. Centering was performed for rotating the silicon crystal material.

Thereafter, an FZ silicon single crystal was grown by a commonly practiced CZ method, thereby manufacturing an FZ silicon single crystal having a straight body portion of 1000 mm in length and 150 mm in diameter.

In comparison with Comparative Example 1, loss of a silicon crystal material could be reduced by about 7.5 kg (about 11%) per bar in Examples 1 to 4. In addition, operations such as centering, for rotation of the silicon crystal material after loading, could be performed in Examples 1 to 4 with no difference from Comparative Example 1.

Furthermore, although it took about 45 minutes for cutting off and forming the groove in Comparative Example 1, these operations were not required in Examples 1 to 4 and therefore total manufacturing time and manufacturing cost could be reduced.

The invention claimed is:
1. A method for manufacturing a silicon single crystal by using a silicon crystal material, the method comprising:
   manufacturing the silicon crystal material by the Czochralski method, the silicon crystal material comprising a shoulder portion gradually growing in diameter, a cylindrical straight body portion, a tail portion gradually reducing in diameter, and a gripped portion, the gripped portion being a convex portion formed immediately above the tail portion and along a circumference of the cylindrical straight body portion;
   attaching a gripper to the gripped portion of the silicon crystal material which has been formed in the manufacturing by the Czochralski method; and
   placing the silicon crystal material to which the gripper is attached in a furnace such that the silicon single crystal is grown by the floating zone method.

2. A method for manufacturing a silicon single crystal by using a silicon crystal material, the method comprising:
  manufacturing the silicon crystal material by the Czochralski method, the silicon crystal material comprising a shoulder portion gradually growing in diameter, a cylindrical straight body portion, a tail portion gradually reducing in diameter and a gripped portion;
  attaching a gripper to the gripped portion of the silicon crystal material which has been formed in the manufacturing by the Czochralski method; and
  placing the silicon crystal material to which the gripper is attached in a furnace such that the silicon single crystal is grown by the floating zone method,
  wherein the gripped portion is a seed crystal used in the manufacturing of the silicon crystal material by the Czochralski method, the silicon crystal material being removed from a CZ furnace and after crystal growth by the CZ method in a state where the seed crystal, neck portion, and cylindrical straight body portion have been successively formed, and
  wherein the seed crystal and the cylindrical straight body portion are coaxial.

3. The method according to claim 2, wherein the neck portion is at least 5 mm in diameter.

4. A method for manufacturing a silicon single crystal by using a silicon crystal material, the method comprising:
  manufacturing the silicon crystal material by the Czochralski method, the silicon crystal material comprising a shoulder portion gradually growing in diameter, a cylindrical straight body portion, a tail portion gradually reducing in diameter and a gripped portion;
  attaching a gripper to the gripped portion of the silicon crystal material which has been formed in the manufacturing by the Czochralski method; and
  placing the silicon crystal material to which the gripper is attached in a furnace such that the silicon single crystal is grown by the floating zone method,
  wherein the gripped portion is a seed crystal used in the manufacturing of the silicon crystal material by the Czochralski method, the silicon crystal material being removed after crystal growth by the CZ method from a CZ furnace in a state where the seed crystal, a neck portion, and the cylindrical straight body portion have been successively formed.

5. The method according to claim 4, wherein the neck portion is at least 5 mm in diameter.

* * * * *

UNITED STATES PATENT AND TRADEMARK OFFICE
CERTIFICATE OF CORRECTION

PATENT NO.        : 9,181,631 B2
APPLICATION NO.   : 12/524737
DATED             : November 10, 2015
INVENTOR(S)       : S. Togawa et al.

It is certified that error appears in the above-identified patent and that said Letters Patent is hereby corrected as shown below:

In the Specification

Column 7, line 45 please change "or" to --and--

Column 7, lines 45-46 please change "the tail portion 5" to --the tail portion 6--

Column 7, line 66 please change "the convex portion 3" to --the concave portion 7--

Column 8, lines 38 please change "or" to --and--

Column 8, line 39 please change "the tail portion 5" to --the tail portion 6--

Column 8, line 59 please change "the convex portion 3" to --the constricted portion 8--

Column 11, line 38 please change "the FX furnace" to --the FZ furnace--

Signed and Sealed this
Twelfth Day of July, 2016

Michelle K. Lee
*Director of the United States Patent and Trademark Office*